(12) United States Patent
Kim

(10) Patent No.: US 7,729,187 B2
(45) Date of Patent: Jun. 1, 2010

(54) BIT LINE PRECHARGE CIRCUIT HAVING PRECHARGE ELEMENTS OUTSIDE SENSE AMPLIFIER

(75) Inventor: Seung Bong Kim, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 131 days.

(21) Appl. No.: 12/215,800

(22) Filed: Jun. 30, 2008

(65) Prior Publication Data
US 2009/0238019 A1    Sep. 24, 2009

(30) Foreign Application Priority Data
Mar. 21, 2008   (KR) ...................... 10-2008-0026606

(51) Int. Cl.
G11C 7/00   (2006.01)
(52) U.S. Cl. .................. 365/203; 365/190; 365/230.03
(58) Field of Classification Search ................. 365/203, 365/230.03, 230.06, 230.08, 205, 190
See application file for complete search history.

(56) References Cited

U.S. PATENT DOCUMENTS

| 5,426,385 A | 6/1995 | Lai | |
| 5,798,955 A * | 8/1998 | Matsubara | 708/490 |
| 7,260,017 B2 * | 8/2007 | Won | 365/230.04 |
| 2006/0209605 A1 * | 9/2006 | Won | 365/203 |
| 2007/0091686 A1 * | 4/2007 | Won | 365/185.25 |

FOREIGN PATENT DOCUMENTS

| KR | 10-2003-0024462 A | 3/2003 |
| KR | 10-2003-0086679 A | 11/2003 |
| KR | 10-0429889 | 5/2004 |
| KR | 10-2007-0035940 A | 4/2007 |

* cited by examiner

*Primary Examiner*—Gene N. Auduong
(74) *Attorney, Agent, or Firm*—John P. White; Cooper & Dunham LLP

(57) ABSTRACT

A bit line precharge circuit capable of improving bit line precharge operation includes a first precharge element for precharging a first bit line in response to a first precharge signal, a precharge unit for precharging second and third bit lines in response to a second precharge signal, and a second precharge element for precharging a fourth bit line in response to a third precharge signal.

26 Claims, 7 Drawing Sheets

BIT LINE PRECHARGE CIRCUIT HAVING PRECHARGE ELEMENTS OUTSIDE SENSE AMPLIFIER

TECHNICAL FIELD

This disclosure relates to a semiconductor memory device and, more particularly, to a bit line precharge circuit capable of improving a bit line precharge operation.

BACKGROUND

Generally, a bit line precharge circuit in a semiconductor memory device precharges a pair of bit lines to a half of a power supply voltage VCC during a bit line precharge operation. In a precharge operation, it is important to maintain the precharge voltage level of the pair of the bit lines to a half of the power supply voltage VCC in the semiconductor memory device.

In a case that the precharge voltage of the pair of the bit lines is higher than a half of the power supply voltage VCC, the data margin deteriorates at a high voltage level and, in a case that the precharge voltage of the pair of the bit lines is lower than a half of the power supply voltage VCC, the data margin deteriorates at a low level. That is, in a state where the pair of bit lines are precharged to a half of a power supply voltage VCC, a charge sharing operation between the pair of the lines is carried out when a word line connected to a memory cell is selected in an active operation. At this time, in a case that a bit line sense amplifier amplifies a high-level data on the pair of the bit lines when the precharge voltage level is higher than a half of the power supply voltage VCC, the high-level data on the pair of the bit lines cannot be amplified to a sufficient voltage level of the power supply voltage VCC or the amplification cannot be carried out exactly. Similarly, in a case that a bit line sense amplifier amplifies a low-level data on the pair of the bit lines when the precharge voltage level is lower than a half of the power supply voltage VCC, the low-level data on the pair of the bit lines cannot be amplified to a sufficient voltage level of a ground voltage or the amplification cannot be carried out exactly.

Conventional semiconductor memory devices precharge bit lines using a precharge circuit included in a bit line sense amplifier. However, with increase in a level of integration in semiconductor devices, a resistance of bit lines increases and the features of bit line precharge deteriorate because of such an increased resistance.

SUMMARY

In an aspect of this disclosure, a bit line precharge circuit is provided which is capable of improved bit line precharge operation.

In an embodiment, a bit line precharge circuit comprises a first precharge element for precharging a first bit line in response to a first precharge signal, a precharge unit for precharging second and third bit lines in response to a second precharge signal, and a second precharge element for precharging a fourth bit line in response to a third precharge signal.

The first precharge signal is inactivated when an active command is inputted for at least one of first and second cell blocks, and the second cell block is adjacent to the first cell block.

The second precharge signal is inactivated when an active command is inputted for at least one of the first cell block and a third cell block, and the third cell block is adjacent to the first cell block.

The third precharge signal is inactivated when an active command is inputted for at least one of the third cell block and a fourth cell block, and the fourth cell block is adjacent to the third cell block.

The first and second bit lines are formed in a memory cell of the first cell block.

The third and fourth bit lines are formed in a memory cell of the third cell block.

The precharge unit is included in a bit line sense amplifier of the first cell block.

In another embodiment, a bit line precharge circuit comprises a cell precharge signal generating unit for generating first, second and third precharge signals in response to an active command for a first cell block, a first precharge element for precharging a first bit line in response to the first precharge signal, a first precharge unit for precharging a second bit line and a second bit bar line in response to the second precharge signal, wherein the second bit bar line is complementary to the second bit line, and a second precharge element for precharging a third bit line in response to the third precharge signal.

The cell precharge signal generating unit includes a cell block signal generating unit for generating a first cell block signal in response to the active command, and a precharge control unit for generating the first, second and third precharge signals in response to the first cell block signal.

The precharge control unit includes a first precharge signal generating unit configured to receive the first cell block signal and a second cell block signal which is generated in response to an active command for a second cell block adjacent to the first cell block, and generate the first precharge signal, a second precharge signal generating unit configured to receive the first cell block signal and a third cell block signal which is generated in response to an active command for a third cell block adjacent to the firs cell block, and generate the second precharge signal, and a third precharge signal generating unit configured to receive the third cell block signal and a fourth cell block signal which is generated in response to an active command for a fourth cell block adjacent to the third cell block, and generate the third precharge signal.

The first precharge signal generating unit generates the first precharge signal which is inactivated when at least one of the first and second cell block signals is activated.

The first precharge signal generating unit includes a logic unit for performing a logic operation of the first and second cell block signals, and a level shifter for shifting a voltage level of an output signal of the logic unit.

The second precharge signal generating unit generates the second precharge signal which is inactivated when at least one of the first and third cell block signals is activated.

The second precharge signal generating unit includes a logic unit for performing a logic operation of the first and third cell block signals, and a level shifter for shifting a voltage level of an output signal of the logic unit.

The third precharge signal generating unit generates the third precharge signal which is inactivated when at least one of the third and fourth cell block signals is activated.

The third precharge signal generating unit includes a logic unit for performing a logic operation of the third and fourth cell block signals, and a level shifter for shifting a voltage level of an output signal of the logic unit.

The first and second bit lines are formed in a memory cell of the first cell block.

The second bit bar line, which is complementary to the second bit line, and the third bit line are formed in the third cell block.

The first precharge unit is included in a bit line sense amplifier of the first cell block.

The bit line precharge circuit further comprises a first inverter for buffering the first precharge signal and transferring the first precharge signal to the first precharge element, a second inverter for buffering the second precharge signal and transferring the second precharge signal to the first precharge unit, and a third inverter for buffering the third precharge signal and transferring the third precharge signal to the second precharge element. Also, the bit line precharge circuit further comprises a third precharge element included in a fifth cell block adjacent to the second cell block, for precharging a first bit bar line, which is complementary to the first bit line, in response to the fourth precharge signal, a second precharge unit included in the second cell block, for precharging the first bit line and the first bit bar line in response to a fifth precharge signal, a fourth precharge element included in the second cell block, for precharging the second bit line in response to a sixth precharge signal, a fifth precharge element included in the third cell block, for precharging the second bit bar line, which is complementary to the second bit line, in response to a seventh precharge signal, and a third precharge unit included in the third cell block, for precharging the third bit line in response to an eighth precharge signal.

The fourth to eighth precharge signals are inactivated in response to an activation of the first cell block signal.

In still another embodiment, a bit line precharge circuit comprises a mat having first to fourth bit lines, a precharge element for precharging the first to third bit lines in response to a first precharge signal, and a precharge unit for precharging the second to fourth bit lines in response to a second precharge signal.

BRIEF DESCRIPTION OF THE DRAWINGS

The above and other aspects, features and other advantages of the subject matter of this disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through examples and embodiments. The examples and embodiments exemplify application of the present invention, and the scope of this disclosure and the appended claims is not limited by them.

Figure 1:
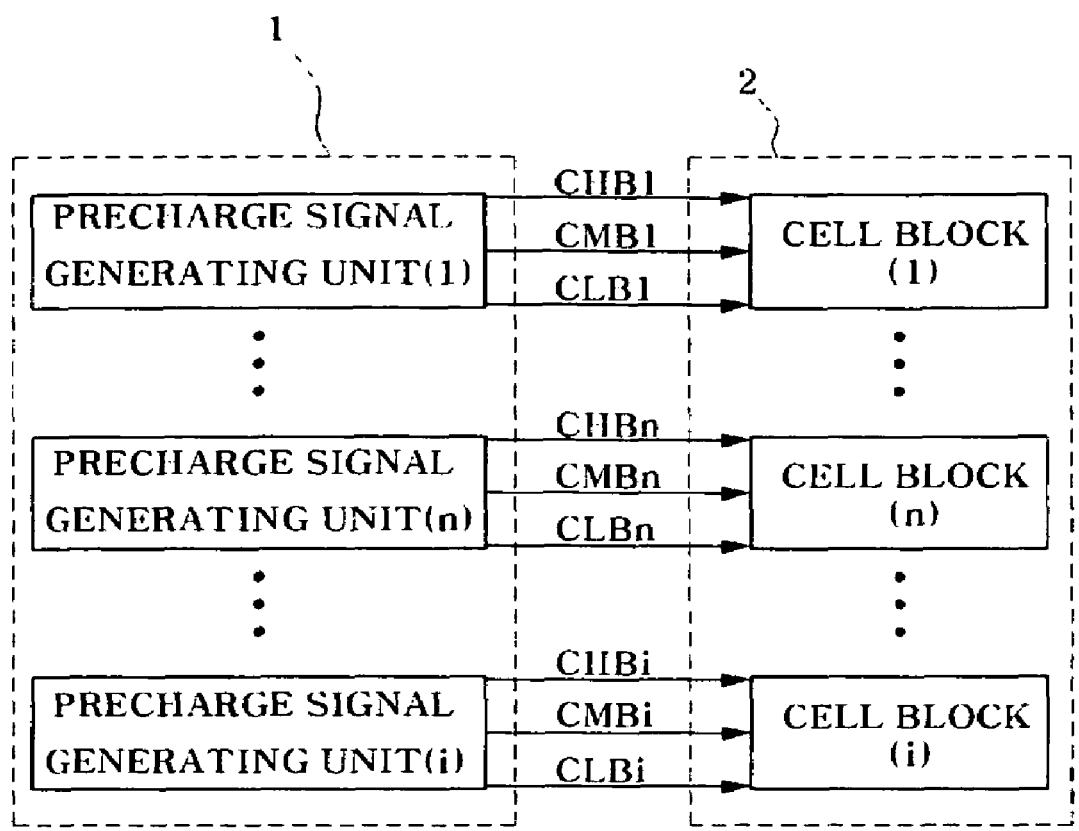
FIG. 1 is a schematic block diagram illustrating a bit line precharge circuit according to an embodiment of disclosure.

FIG. 1 is a schematic block diagram illustrating a bit line precharge circuit according to an embodiment of this disclosure.

Referring to FIG. 1, the bit line precharge circuit according to an embodiment includes a cell precharge signal generating unit 1 and a cell precharge unit 2.

The cell precharge signal generating unit 1 includes first to i-th cell precharge signal generating units (1:i) and produces first to i-th buffered high precharge signals CHB1 to CHBi, respectively, first to i-th buffered middle precharge signals CMB1 to CMBi, respectively, and first to i-th buffered low precharge signals CLB1 to CLBi, respectively.

The cell precharge units 2 includes first to i-th cell blocks which are precharged by the first to i-th high buffered precharge signals CHB1 to CHBi, respectively, the first to i-th buffered middle precharge signals CMB1 to CMBi, respectively, and the first to i-th buffered low precharge signals CLB1 to CLBi, respectively.

The bit line precharge circuit according to an embodiment will be described in detail referring to the n-th cell precharge signal generating unit 12 and the n-th cell block 22 in FIG. 2. In actual semiconductor memory devices, the cell blocks are arranged in a plurality of rows and columns. However, for convenience in illustration, a simple configuration of three rows and one column will be described through FIG. 2.

The n-th cell precharge signal generating unit 12 includes an n-th cell block signal generating unit 106 and an n-th precharge control unit 108. The n-th cell block signal generating unit 106 produces an n-th cell block signal Cn which makes a transition from a high voltage level to a low voltage level when an active command is inputted for an n-th cell block 22. The n-th precharge control unit 108 receives (n−1)th to (n+2)th cell block signals Cn−1, Cn, Cn+1 and Cn+2 and then produces an n-th high precharge signal CHn, an n-th middle precharge signal CMn and an n-th low precharge signal CLn. The (n−1)th to (n+2)th cell block signals Cn−1, Cn, Cn+1 and Cn+2 make a transition from a high voltage level to a low voltage level when active commands are respectively inputted for (n−1)th to (n+1)th cell blocks.

Figure 3:
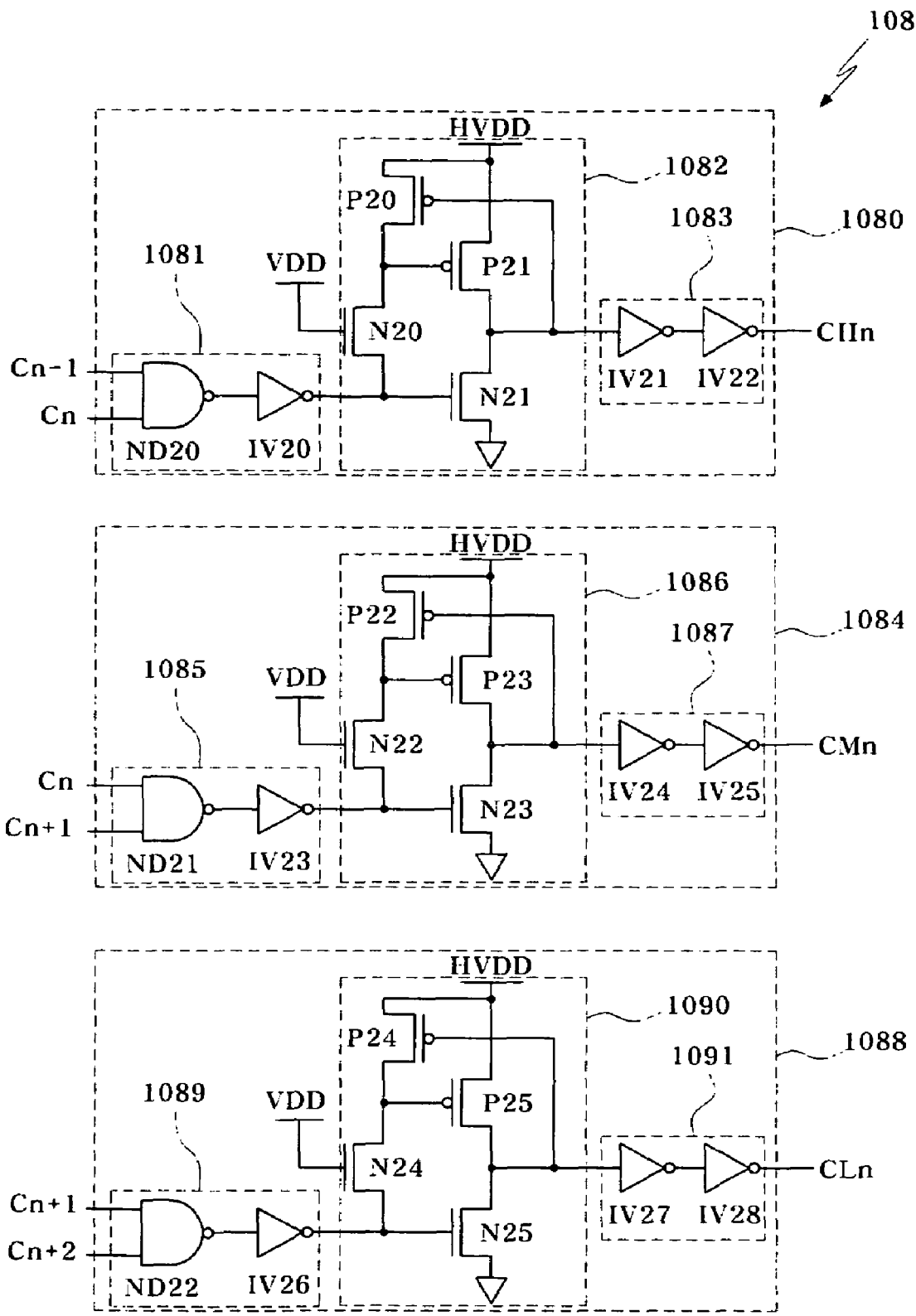
FIG. 3 is a circuit diagram illustrating an n-th precharge control unit of FIG. 2.

As shown in FIG. 3, the n-th precharge control unit 108 includes first to third precharge signal generating units 1080, 1084 and 1088.

The first precharge signal generating unit 1080 includes a logic unit 1081 to perform an AND operation of the (n−1)th cell block signal Cn−1 and the n-th cell block signal Cn, a level shifter 1082 to shift a voltage level of an output signal of the logic unit 1081, and a buffer 1083 for buffering an output signal of the level shifter 1082. Here, the first precharge signal generating unit 1080 produces the n-th high precharge signal CHn which makes a transition from a low voltage level to a high voltage level when at least one of the (n−1)th cell block signal Cn−1 and the n-th cell block signal Cn is inactivated in a low level.

The second precharge signal generating unit 1084 includes a logic unit 1085 to perform an AND operation of the n-th cell block signal Cn and the (n+1)th cell block signal Cn+1, a level shifter 1086 to shift a voltage level of an output signal of the logic unit 1085, and a buffer 1087 for buffering an output signal of the level shifter 1086. Here, the second precharge signal generating unit 1084 produces the n-th middle precharge signal CMn which makes a transition from a low voltage level to a high voltage level when at least one of the n-th cell block signal Cn and the (n+1)th cell block signal Cn+1 is inactivated in a low level.

The third precharge signal generating unit 1088 includes a logic unit 1089 to perform an AND operation of the (n+1)th cell block signal Cn+1 and the (n+2)th cell block signal Cn+2, a level shifter 1090 to shift a voltage level of an output signal of the logic unit 1089, and a buffer 1091 for buffering an output signal of the level shifter 1090. Here, the third precharge signal generating unit 1088 produces the n-th low precharge signal CLn performs a transition from a low voltage level to a high voltage level when at least one of the (n+1)th cell block signal Cn+1 and the (n+2)th cell block signal Cn+2 is inactivated in a low level.

The n-th cell block 22 includes an n-th sub word line signal generating unit 220, an n-th mat 222, an n-th buffer unit 224, an n-th up-precharge element 226, an n-th bit line sense amplifier 228 and an n-th down-precharge element 230.

The n-th sub word line signal generating unit 220 produces word line signals WL0 to WLj which are activated when the active command is inputted for the n-th cell block 22.

A plurality of memory cells and a plurality of bit lines, which are correspondent to the plurality of memory cells, are included in the n-th mat 222. However, only two lines, a first bit line BL0 and a second bit line BL1, are shown in FIG. 2 for convenience in illustration.

Figure 4:
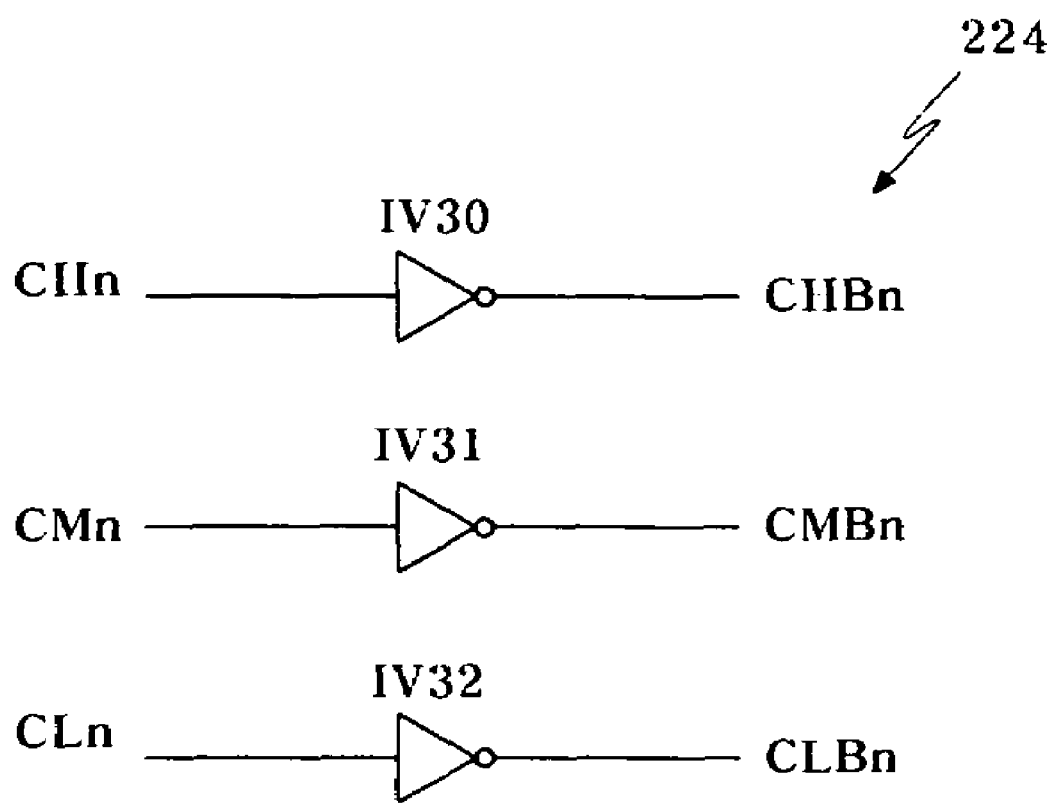
FIG. 4 is a circuit diagram illustrating an n-th buffer of FIG. 2.

Referring to FIG. 4, the n-th buffer unit 224 includes inverters IV30, IV31 and IV32 which receive the n-th high precharge signal CHn, the n-th middle precharge signal CMn and the n-th low precharge signal CLn, respectively, and then output the n-th buffered high precharge signal CHBn, the n-th buffered middle precharge signal CMBn and the n-th buffered low precharge signal CLBn, respectively.

Figure 5:
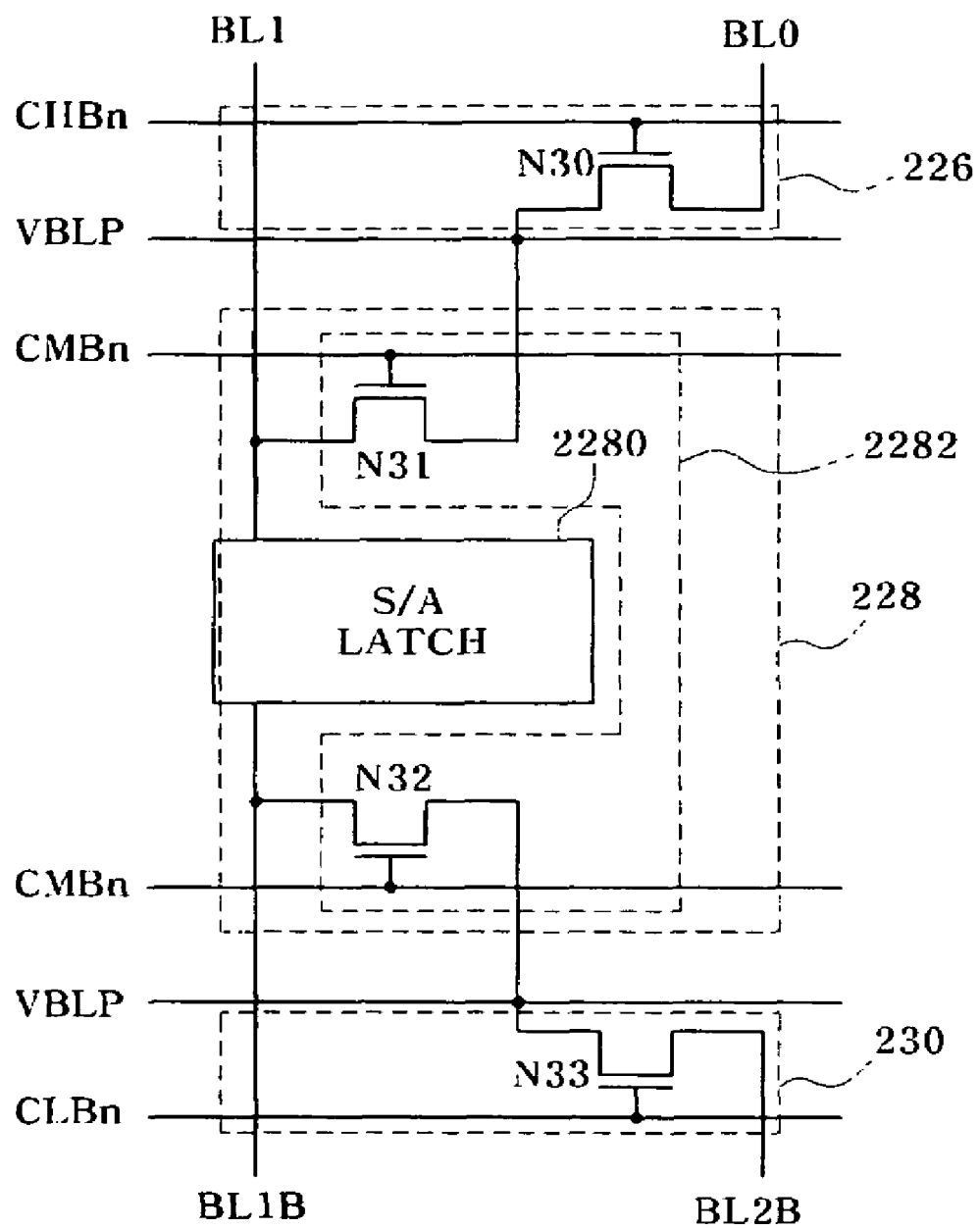
FIG. 5 is a circuit diagram illustrating an n-th up-precharge element, an n-th bit line sense amplifier and an n-th down-precharge element of FIG. 2.
Figure 6:
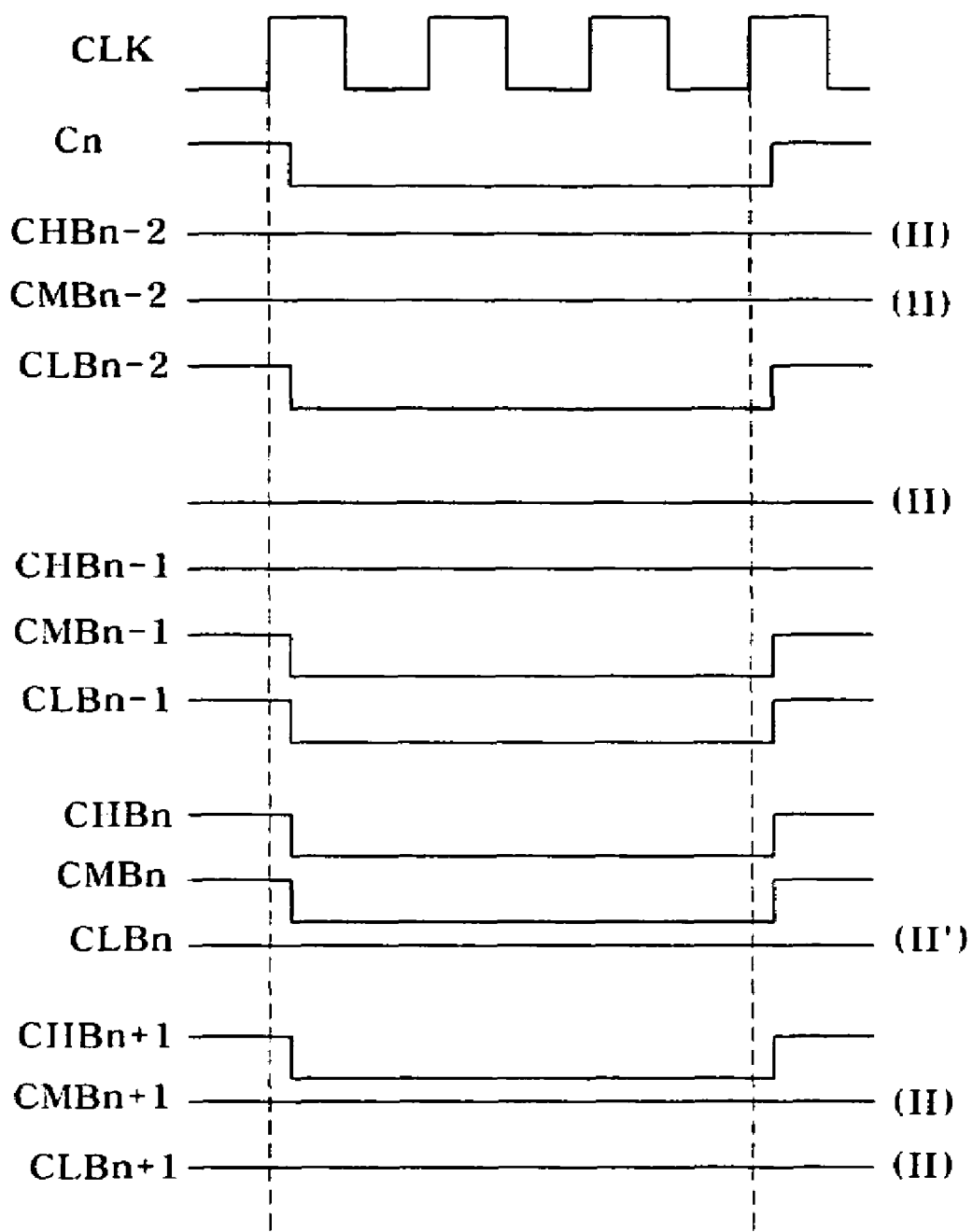
FIG. 6 is a timing chart illustrating an operation of the bit line precharge circuit of FIG. 2.

FIG. 5 is a circuit diagram illustrating the n-th up-precharge element 226, the n-th bit line sense amplifier 228 and the n-th down-precharge element 230

Referring to FIG. 5, the n-th up-precharge element 226 includes an NMOS transistor N30. The NMOS transistor N30 is connected to the first bit line BL0 and a bit line precharge voltage VBLP and is turned on in response to the n-th buffered high precharge signal CHBn. A first bit bar line BL0B which is complementary to the first bit line BL0 is disposed in an (n−1)th mat 210.

The n-th bit line sense amplifier 228 includes a sense amplifier latch 2280 and a precharge unit 2282. The precharge unit 2282 includes NMOS transistors N31 and N32. The NMOS transistor N31 is connected between the second bit line BL1 and the bit line precharge voltage VBLP and is turned on in response to the n-th buffered middle precharge signal CMBn. The NMOS transistor N32 is connected between the bit line precharge voltage VBLP and a second bit bar line BL1B, which is complementary to the second bit line BL1, and is turned on in response to the n-th buffered middle precharge signal CMBn. A precharge state of the bit line sense amplifier 228 is determined when the NMOS transistors N31 and N32 are turned on in response to the n-th buffered middle precharge signal CMBn of a high voltage level and then the bit line precharge voltage VBLP is applied to the second bit line BL1 and the second bit bar line BL1B. Here, the second bit bar line BL1B which is complementary to the second bit line BL2 is disposed in an (n+1)th mat 234

The down-precharge element 230 includes an NMOS transistor N33 which is connected to the bit line precharge voltage VBLP and a third bit bar line BL2B and is turned on in response to the n-th buffered low precharge signal CLBn. Here, the third bit bar line BL2B which is complementary to a third bit line BL2 is disposed in an (n+1)th mat 234 and the third bit line BL2 is disposed in an (n+2)th mat (not shown).

As mentioned above, the bit line precharge circuit according to the present invention is illustrated based on the n-th cell precharge signal generating unit 12 and the n-th cell block 22. Other blocks (shown in FIG. 2), which are not illustrated above, can be analogized out of the n-th cell precharge signal generating unit 12 and the n-th cell block 22.

The operation of the bit line precharge will be described in detail with reference to FIGS. 2 to 6.

First, at the precharge state, the cell block signal generating units CBSG(1:i) included in the bit line precharge circuit produce the first to the i-th cell block signals C1 to Ci, respectively, of a high voltage level. Accordingly, the first to i-th precharge control units PCU(1:i) produce the first to i-th high precharge signals CH1-CHi, respectively, the first to i-th middle precharge signals CM1-CMi, respectively, and the first to i-th low precharge signals CL1-CLi in a low voltage level, respectively.

The first to i-th buffered high precharge signals CHB1 to CHBi, the first to i-th buffered middle precharge signals CMB1 to CMBi and the first to i-th buffered low precharge signals CLB1 to CLBi, which are generated by the first to i-th buffer units BUFFER(1:i), are in a high voltage level such that all of the NMOS transistors, which are included in the first to i-th up-precharge elements UPDP(1:i), the first to i-th bit line sense amplifiers S/A(1:i) and the first to i-th down-precharge elements DNDP(1:i), are turned on and then all of the bit lines included in the cell precharge unit 2 are precharged to the precharge voltage VBLP.

Figure 2:
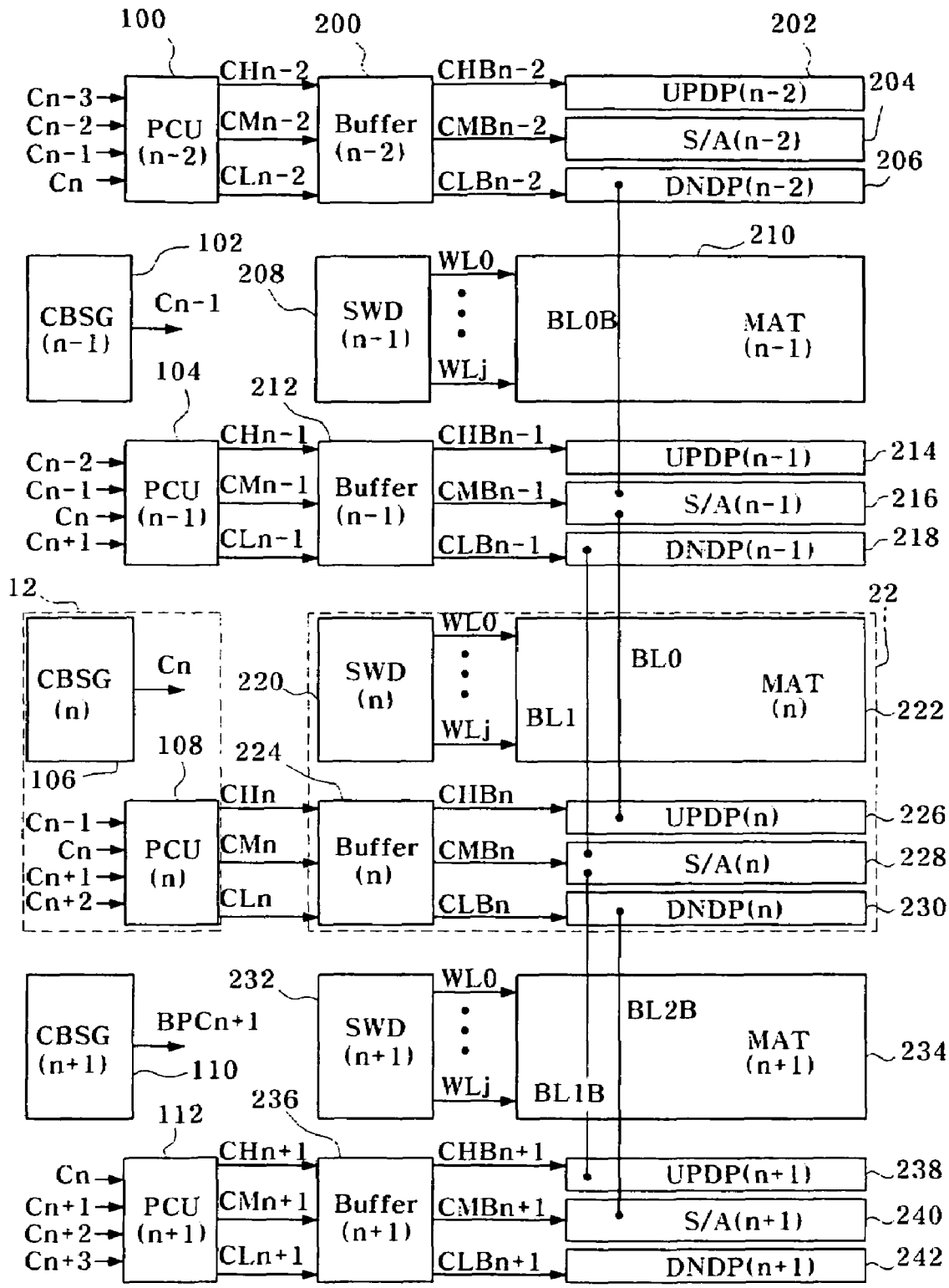
FIG. 2 is a detailed block diagram illustrating the bit line precharge circuit of FIG. 1.

When the active command for the n-th cell block 22 of FIG. 2 is inputted at the precharge state, the n-th cell block signal Cn generated by the n-th cell block signal generating unit 106 makes a transition from a high voltage level to a low voltage level.

Referring to FIG. 3, the n-th precharge control unit 108, which receives the n-th cell block signal Cn of a low voltage level, produces the n-th high precharge signal CHn and the n-th middle precharge signal CMn which undergo transition from a low voltage level to a high voltage level. More in detail, the logic units 1081 and 1085 output respective low level signals based on the n-th cell block signal Cn of a low voltage level. Accordingly, the NMOS transistors N20 and N22 and the PMOS transistors P21 and P23 are turned on so that both the n-th high precharge signal CHn and the n-th middle precharge signal CMn undergo transition to a high voltage level. At this time, the output signals outputted from the level shifters 1082, 1086 and 1090 are level-shifted signals which are shifted to a high voltage level of a high power supply voltage HVDD.

The n-th high precharge signal CHn and the n-th middle precharge signal CMn, which undergo transition to a high voltage level, are buffered by the n-th buffer unit 224 of FIG. 4 and release the precharge states of the n-th up-precharge element 226 and the n-th bit line sense amplifier 228. More concretely, referring to FIG. 5, the n-th buffered high precharge signal CHBn and the n-th buffered middle precharge signal CMBn, which are buffered by the n-th buffer unit 224, are in a low voltage level. Accordingly, the NMOS transistors N30, N31 and N32 are turned off so that the precharge voltage VBLP is not applied to the first bit line BL0, the second bit line BL1 and the second bit bar line BL1B.

Further, the (n−2)th precharge control unit 100 which receives the n-th cell block signal Cn of a low voltage level produces the (n−2)th low precharge signal CLn−2 which undergoes transition to a high voltage level. The (n−2)th low precharge signal CLn−2 of a high voltage level is buffered by the (n−2)th buffer unit 200 so that the precharge state of the (n−2)th down-precharge element 206 is released. Accordingly, the precharge voltage VBLP is not applied to the first bit bar line BL0B which is complementary to the first bit line BL0.

The (n−1)th precharge control unit 104 which receives the n-th cell block signal Cn of a low voltage level produces the (n−1)th middle precharge signal CMn−1 and the (n−1)th low precharge signal CLn−1 which undergo transition to a high voltage level. The (n−1)th middle precharge signal CMn−1 and the (n−1)th low precharge signal CLn−1 of the high voltage level are buffered by the (n−1)th buffer unit 212 and the precharge states of the (n−1)th bit line sense amplifier 216 and the (n−1)th down-precharge element 218 are released. Accordingly, the precharge voltage VBLP is not applied to the first bit bar line BL0B, the first bit bar line BL0B and the second bit line BL1.

Also, the (n+1)th precharge control unit 112 which receives the n-th cell block signal Cn of a low voltage level produces the (n+1)th high precharge signal CHn+1 which undergoes transition to a high voltage level. The (n+1)th high precharge signal CHn+1 of the high voltage level is buffered by the (n+1)th buffer unit 236 so that the precharge state of the (n+1)th up-precharge element 238 is released. Accordingly, the precharge voltage VBLP is not applied to the second bit bar line BL1B which is complementary to the second bit line BL1.

Referring again to FIG. 6, the n-th cell block signal Cn is undergoes transition from a high voltage level to a low voltage level and the (n−2)th buffered low precharge signal (CLBn−2), the (n−1)th buffered middle precharge signal CMBn−1, the (n−1)th buffered low precharge signal CLBn−1, the n-th buffered high precharge signal CHBn, the n-th buffered middle precharge signal CMBn and the (n+1)th buffered high precharge signal CHBn+1, which are buffered by the n-th cell block signal Cn of a low voltage level, undergo transition to a low voltage level. Accordingly, the precharge states of first and second bit lines BL0 and BL1 in the n-th mat 222 are released. Further, the precharge state of the first bit bar line BL0B in the (n−1)th mat 210 is released and the precharge state of the second bit bat line BL1B is also released.

As mentioned above, the present invention improves the precharge operation features by performing the bit line precharge through the precharge elements of both the up-precharge element and the down-precharge element with the sense amplifier, which is different from the conventional bit line precharge circuit in which the precharge operation is carried out only by a precharge element included in a bit line sense amplifier.

Figure 7:
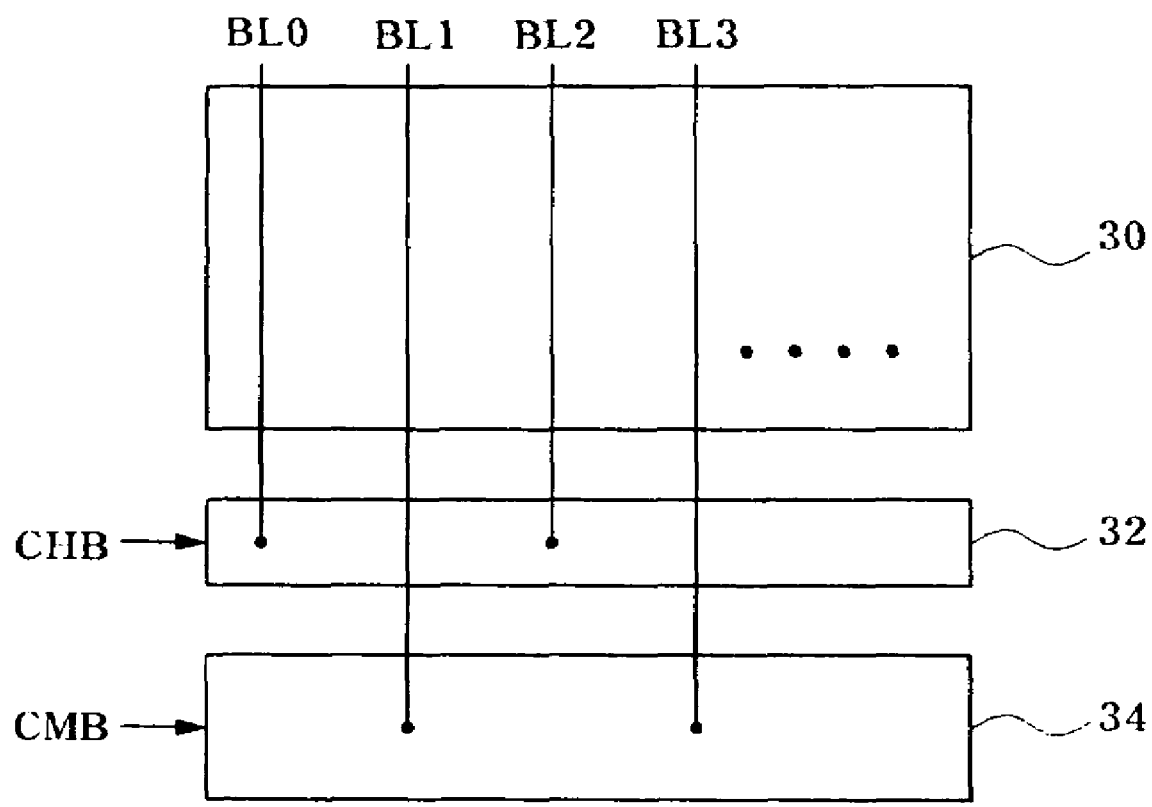
FIG. 7 is a detailed block diagram illustrating an example of configuration of a mat, a precharge element and a precharge unit in the bit line precharge circuit of FIG. 1.

FIG. 7 is a detailed block diagram illustrating an example of configuration of the mat, the precharge elements and the precharge unit of FIG. 2.

Referring to FIG. 7, the first bit line BL0 and the third bit line BL2 in a mat 30 are coupled to the precharge element 32 and the second bit line BL1 and a fourth bit line BL3 are coupled to the precharge unit 34 which is included in a bit line sense amplifier. One or more additional bit lines (not shown) in the mat 30 are coupled to the precharge element 32, and one or more additional bit lines in the mat 30 are coupled to the precharge unit 34.

The precharge element 32 precharges the first and third bit lines BL0 and BL2 in response to the buffered high precharge signal CHB and the precharge unit 34 precharges the second and fourth bit lines BL1 and BL3 in response to the buffered middle precharge signal CMB. The buffered high precharge signal CHB is inactivated when an active command is inputted for a cell block including the mat 30 or for another cell block adjacent to the cell block. Also, the buffered middle precharge signal CMB is inactivated when an active command is inputted for a cell block including the mat 30 or for another cell block adjacent to the cell block.

While the present invention has been described with respect to particular examples and embodiments, it will be apparent to those skilled in the art that various changes and modifications may be made without departing from the spirit and scope of this disclosure and the following claims.

This disclosure claims priority to Korean application number 10-2008-0026606, filed on Mar. 21, 2008, the entire contents of which are incorporated herein by reference.

What is claimed is:

1. A bit line precharge circuit comprising:
   a first precharge element for precharging a first bit line in response to a first precharge signal;
   a precharge unit for precharging second and third bit lines in response to a second precharge signal; and
   a second precharge element for precharging a fourth bit line in response to a third precharge signal.

2. The bit line precharge circuit of claim 1, wherein the first precharge signal is inactivated when an active command is inputted for at least one of first and second cell blocks, and the second cell block is adjacent to the first cell block.

3. The bit line precharge circuit of claim 2, wherein the second precharge signal is inactivated when an active command is inputted for at least one of the first cell block and a third cell block, and the third cell block is adjacent to the first cell block.

4. The bit line precharge circuit of claim 3, wherein the third precharge signal is inactivated when an active command is inputted for at least one of the third cell block and a fourth cell block, and the fourth cell block is adjacent to the third cell block.

5. The bit line precharge circuit of claim 2, wherein the first and second bit lines are formed in a memory cell of the first cell block.

6. The bit line precharge circuit of claim 3, wherein the third and fourth bit lines are formed in a memory cell of the third cell block.

7. The bit line precharge circuit of claim 2, wherein the precharge unit is included in a bit line sense amplifier of the first cell block.

8. A bit line precharge circuit comprising:
   a cell precharge signal generating unit for generating first, second and third precharge signals in response to an active command for a first cell block;
   a first precharge element for precharging a first bit line in response to the first precharge signal;
   a first precharge unit for precharging a second bit line and a second bit bar line in response to the second precharge signal, wherein the second bit bar line is complementary to the second bit line; and
   a second precharge element for precharging a third bit line in response to the third precharge signal.

9. The bit line precharge circuit of claim 8, wherein the cell precharge signal generating unit includes:
   a cell block signal generating unit for generating a first cell block signal in response to the active command; and
   a precharge control unit for generating the first, second and third precharge signals in response to the first cell block signal.

10. The bit line precharge circuit of claim 9, wherein the precharge control unit includes:
    a first precharge signal generating unit configured to receive the first cell block signal and a second cell block signal which is generated in response to an active command for a second cell block adjacent to the first cell block, and generate first precharge signal;
    a second precharge signal generating unit configured to receive the first cell block signal and a third cell block signal which is generated in response to an active command for a third cell block adjacent to the firs cell block, and generate second precharge signal; and
    a third precharge signal generating unit configured to receive the third cell block signal and a fourth cell block signal which is generated in response to an active command for a fourth cell block adjacent to the third cell block, and generate third precharge signal.

11. The bit line precharge circuit of claim 10, wherein the first precharge signal generating unit generates the first precharge signal which is inactivated when at least one of the first and second cell block signals is activated.

12. The bit line precharge circuit of claim 11, wherein the first precharge signal generating unit includes:
   a logic unit for performing a logic operation of the first and second cell block signals; and
   a level shifter for shifting a voltage level of an output signal of the logic unit.

13. The bit line precharge circuit of claim 10, wherein the second precharge signal generating unit generates the second precharge signal which is inactivated when at least one of the first and third cell block signals is activated.

14. The bit line precharge circuit of claim 13, wherein the second precharge signal generating unit includes:
   a logic unit for performing a logic operation of the first and third cell block signals; and
   a level shifter for shifting a voltage level of an output signal of the logic unit.

15. The bit line precharge circuit of claim 10, wherein the third precharge signal generating unit generates the third precharge signal which is inactivated when at least one of the third and fourth cell block signals is activated.

16. The bit line precharge circuit of claim 15, wherein the third precharge signal generating unit includes:
   a logic unit for performing a logic operation of the third and fourth cell block signals; and
   a level shifter for shifting a voltage level of an output signal of the logic unit.

17. The bit line precharge circuit of claim 8, wherein the first and second bit lines are formed in a memory cell of the first cell block.

18. The bit line precharge circuit of claim 10, wherein the second bit bar line, which is complementary to the second bit line, and the third bit line are formed in the third cell block.

19. The bit line precharge circuit of claim 8, wherein the first precharge unit is included in a bit line sense amplifier of the first cell block.

20. The bit line precharge circuit of claim 8, further comprising:
   a first inverter for buffering the first precharge signal and transferring the first precharge signal to the first precharge element;
   a second inverter for buffering the second precharge signal and transferring the second precharge signal to the first precharge unit; and
   a third inverter for buffering the third precharge signal and transferring the third precharge signal to the second precharge element.

21. The bit line precharge circuit of claim 10, further comprising:
   a third precharge element included in a fifth cell block adjacent to the second cell block, for precharging a first bit bar line which is complementary to the first bit line in response to the fourth precharge signal;
   a second precharge unit included in the second cell block, for precharging the first bit line and the first bit bar line in response to a fifth precharge signal;
   a fourth precharge element included in the second cell block, for precharging the second bit line in response to a sixth precharge signal;
   a fifth precharge element included in the third cell block, for precharging the second bit bar line, which is complementary to the second bit line, in response to a seventh precharge signal; and
   a third precharge unit included in the third cell block, for precharging the third bit line in response to an eighth precharge signal.

22. The bit line precharge circuit of claim 21, wherein the fourth to eighth precharge signals are inactivated in response to an activation of the first cell block signal.

23. A bit line precharge circuit comprising:
   a mat having first to fourth bit lines;
   a precharge element for precharging the first to third bit lines in response to a first precharge signal; and
   a precharge unit for precharging the second to fourth bit lines in response to a second precharge signal.

24. The bit line precharge circuit of claim 23, wherein the first precharge signal is inactivated when an active command is inputted for at least one of first and second cell blocks, and the second cell block is adjacent to the first cell block.

25. The bit line precharge circuit of claim 24, wherein the second precharge signal is inactivated when an active command is inputted for at least one of the first cell block and a third cell block, and the third cell block is adjacent to the first cell block.

26. The bit line precharge circuit of claim 23, wherein the precharge unit is included in a bit line sense amplifier of the first cell block having the mat.

* * * * *